United States Patent
Lee et al.

(10) Patent No.: US 10,908,846 B2
(45) Date of Patent: Feb. 2, 2021

(54) MEMORY SYSTEM AND OPERATION METHOD THEREOF

(71) Applicant: SK hynix Inc., Gyeonggi-do (KR)

(72) Inventors: Jun-Seo Lee, Chungcheongbuk-do (KR); Nam-Yul Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/562,722

(22) Filed: Sep. 6, 2019

(65) Prior Publication Data

US 2020/0218469 A1    Jul. 9, 2020

(30) Foreign Application Priority Data

Jan. 3, 2019  (KR) .......................... 10-2019-0000681

(51) Int. Cl.
| | | |
|---|---|---|
| *G11C 11/406* | (2006.01) | |
| *G06F 3/06* | (2006.01) | |
| *G11C 11/408* | (2006.01) | |

(52) U.S. Cl.
CPC .......... *G06F 3/0659* (2013.01); *G06F 3/0604* (2013.01); *G06F 3/0679* (2013.01); *G11C 11/406* (2013.01); *G11C 11/4087* (2013.01)

(58) Field of Classification Search
CPC .... G06F 3/0659; G06F 3/0604; G06F 3/0679; G11C 11/406; G11C 11/4087
USPC ....................................................... 365/222
See application file for complete search history.

(56) References Cited

U.S. PATENT DOCUMENTS

| 5,471,087 | A  | * | 11/1995 | Buerger, Jr. ............ G11C 11/24 |
|---|---|---|---|---|
| | | | | 257/532 |
| 9,865,326 | B2 | | 1/2018 | Bains et al. |
| 9,870,814 | B2 | | 1/2018 | Emmot |
| 2002/0050606 | A1 | * | 5/2002 | Buerger, Jr. ............ G11C 11/24 |
| | | | | 257/202 |
| 2011/0007592 | A1 | * | 1/2011 | Tashiro ............. G11C 11/40618 |
| | | | | 365/222 |
| 2011/0258368 | A1 | * | 10/2011 | Kim ..................... G06F 12/0246 |
| | | | | 711/103 |
| 2015/0109871 | A1 | * | 4/2015 | Bains .................... G11C 11/408 |
| | | | | 365/222 |
| 2015/0155030 | A1 | * | 6/2015 | Song ...................... G11C 5/025 |
| | | | | 365/222 |
| 2016/0027492 | A1 | * | 1/2016 | Byun ...................... G11C 8/10 |
| | | | | 365/222 |

FOREIGN PATENT DOCUMENTS

KR    10-2015-0085485    7/2015

* cited by examiner

*Primary Examiner* — Harry W Byrne
(74) *Attorney, Agent, or Firm* — IP & T Group LLP

(57) ABSTRACT

A memory system may include: a memory pool including a plurality of memory regions; and a controller suitable for controlling the memory pool, wherein each of the memory regions includes one or more row groups, each row group having a predetermined row group size, and wherein the controller counts the numbers of row accesses to the respective memory regions, determines row group sizes according to the row access counts of the respective memory regions, increases a representative access count of a row group including a certain row when the row is accessed, and provides a command to the memory pool to perform a target refresh operation on a target row group whose representative access count exceeds a threshold value.

16 Claims, 8 Drawing Sheets

FIG. 4A

| Row | 1010 |
|---|---|
| 1 | |
| 2 | |
| 3 | |
| 4 | |
| 5 | |
| 6 | |
| 7 | |
| 8 | |
| 9 | |
| 10 | |
| 11 | |
| 12 | |
| 13 | |
| 14 | |
| 15 | |
| 16 | |
| 17 | |
| 18 | |

| Row group | Row | Access Count |
|---|---|---|
| 1 | 1,2,3 | |
| 2 | 4,5,6 | |
| 3 | 7,8,9 | |
| 4 | 10,11,12 | |
| 5 | 13,14,15 | |
| 6 | 16,17,18 | |

MEMORY SYSTEM AND OPERATION METHOD THEREOF

CROSS-REFERENCE TO RELATED APPLICATION

This application claims priority under 35 U.S.C. § 119 to Korean Patent Application No. 10-2019-0000681 filed on Jan. 3, 2019, which is incorporated herein by reference in its entirety.

BACKGROUND

1. Field

Exemplary embodiments relate to a memory system, and more particularly, to a memory system including a memory device, and an operation method thereof.

2. Discussion of the Related Art

The computer environment paradigm has been transitioning to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Since memory systems have no moving parts, memory systems provide advantages such as excellent stability and durability, high information access speed, and low power consumption.

When a memory cell is continuously accessed, memory cells adjacent to the corresponding memory cell may be consistently affected by an electromagnetic field. In this case, data stored in the memory cells may be distorted. Such a phenomenon is referred to as row hammering.

SUMMARY

Various embodiments are directed to a method capable of preventing data distortion caused by row hammering while efficiently using limited memory resources and power of a memory system, and a memory system using the same.

In an embodiment, a memory system may include: a memory pool including a plurality of memory regions; and a controller suitable for controlling the memory pool, wherein each of the memory regions includes one or more row groups, each row group having a predetermined row group size, and wherein the controller counts the number of row accesses to the respective memory regions, determines row group sizes according to the row access counts of the respective memory regions, increases a representative access count of a row group including a certain row when the row is accessed, and provides a command to the memory pool to perform a target refresh operation on a target row group whose representative access count exceeds a threshold value.

In an embodiment, there is provided an operation method of a memory system which includes a plurality of memory regions each including one or more row groups, each row group having a predetermined row group size. The operation method may include: counting the number of row accesses to the respective memory regions; determining row group sizes according to the row access counts of the respective memory regions; increasing a representative access count of a row group including a certain row when the row is accessed; and providing a command to the memory pool to perform a target refresh operation on a target row group whose representative access count exceeds a threshold value.

In an embodiment, there is provided a memory system which includes a memory pool including a plurality of memory devices; and a controller suitable for: determining row access counts for each of a plurality of memory sets, each memory set including two or more memory devices; allocating a size of a row group for each memory set, based on the corresponding row access counts, the row group including a plurality of rows; updating group row access counts of a corresponding row group, in response to an access request; performing a refresh operation on the corresponding row group based on the updated group row access counts.

BRIEF DESCRIPTION OF THE DRAWINGS

FIG. 4A schematically illustrates a memory cell array.

FIG. 4B schematically illustrates a part of data stored in a memory.

DETAILED DESCRIPTION

Hereafter, exemplary embodiments will be described in detail with reference to the accompanying drawings. It should be understood that the following descriptions will be focused on portions required for understanding an operation in accordance with an embodiment, and descriptions of the other portions will be left out in order not to unnecessarily obscure subject matters of the present disclosure.

Hereafter, exemplary embodiments will be described in more detail with reference to the accompanying drawings.

Figure 1:
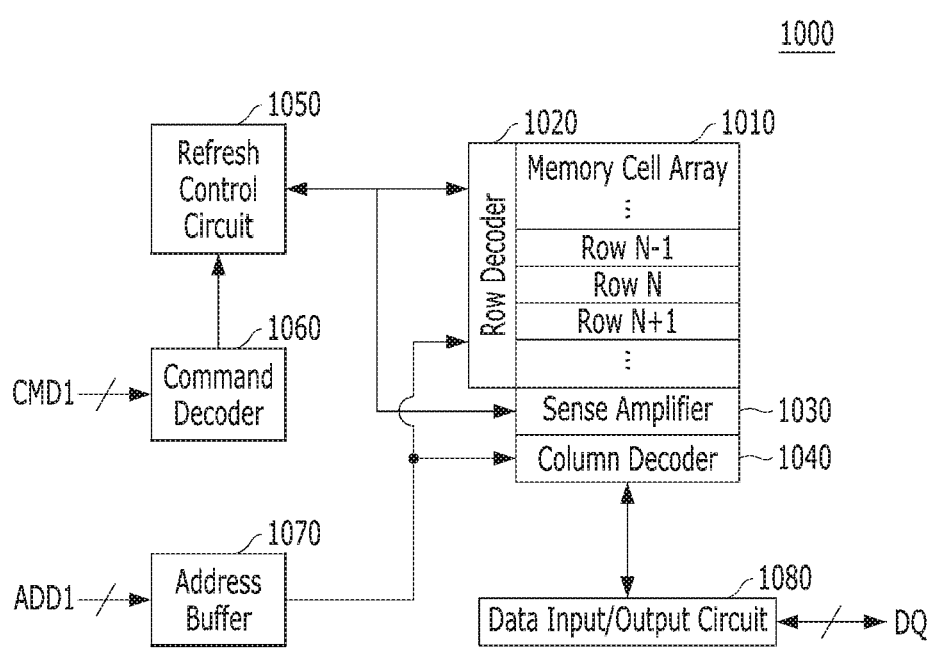
FIG. 1 is a block diagram illustrating a memory device including a memory cell array.

FIG. 1 is a block diagram illustrating a memory device 1000. The case in which the memory device 1000 is a dynamic random access memory (DRAM) will be exemplified to describe the present embodiment.

Referring to FIG. 1, the memory device 1000 may include a memory cell array 1010, a row decoder 1020, a sense amplifier 1030, a column decoder 1040, a refresh control circuit 1050, a command decoder 1060, an address buffer 1070 and a data input and output (input/output) circuit 1080.

The memory cell array 1010 may include a plurality of memory cells arranged in row and column directions. In this specification, memory cells arranged in one row direction may be defined as a row.

By way of example, FIG. 1 illustrates row-direction arrangements of memory cells. The plurality of memory cells may include not only normal memory cells used for storing data, but also redundancy cells for replacing memory cells in which an error has occurred. The redundancy cells may have the same structure as the normal memory cells, and a redundancy cell array including the redundancy cells may be used as the extra memory region of the memory device 1000.

The command decoder 1060 may receive a command CMD1 from a controller (not shown), and internally generate control signals by decoding the command CMD1. The control signals may include an active signal, read signal, write signal and refresh signal. The refresh control circuit 1050 may receive the refresh signal from the command decoder 1060, and output a row address to the row decoder 1020 in order to refresh one word line of the memory cell array 1010.

The memory device 100 may receive an address ADD1 with the command CMD1 from the controller. The address ADD1 may designate a memory cell of the memory cell array 1010 to/from which data is to be written/read. The address buffer 1070 may receive the address ADD1 from the controller and generate row and column addresses.

The row decoder 1020 may decode the row address which is outputted from the refresh control circuit 1050 or the address buffer 1070 in order to designate one word line of the memory cell array 1010. That is, the row decoder 1020 may decode the row address outputted from the address buffer 1070 and enable a word line coupled to a memory cell to/from which data is to be written/read, during a write/read operation. Furthermore, the row decoder 1020 may refresh the word line corresponding to the row address outputted from the refresh control circuit 1050.

The sense amplifier 1030 may sense and amplify data of a memory cell coupled to the word line designated by the row decoder 1020, and store the data of the memory cell. The column decoder 1040 may decode the column address outputted from the address buffer 1070, in order to designate one or more bit lines coupled to one or more memory cells to or from which data is to be inputted or outputted.

The data input/output circuit 1080 may output data received from the memory cell in the memory cell array 1010 through the sense amplifier 1030, or input data to the corresponding memory cell. As a result, the data inputted through the data input/output circuit 1080 may be written to the memory cell array 1010 based on the address ADD1, or the data read from the memory cell array 1010 based on the address ADD1 may be outputted to the controller through the data input/output circuit 1080.

When the row decoder 1020 applies a voltage to a word line corresponding to an $N^{th}$ row Row_N in order to access the $N^{th}$ row Row_N, an electromagnetic field may be formed around the corresponding word line. When the $N^{th}$ row Row_N is frequently accessed, neighboring rows of the Nth row Row_N, for example, an (N−1)th row Row_N−1 and an $(N+1)^{th}$ row Row_N+1, may be consistently affected by the electromagnetic field, and data stored in the neighboring rows may be distorted. That is, row hammering may occur.

In order to prevent a loss of data stored in the memory cell array 1010 due to row hammering, a target refresh operation may be performed. Specifically, when a certain row is frequently accessed, the target refresh operation may be performed on neighboring rows of the row.

The controller for controlling the memory device 1000 may count the number of accesses to each of the rows of the memory cell array 1010, in order to determine how frequently the memory cells within the memory cell array 1010 are accessed. With the increase in capacity of a memory system, the controller may control a memory pool including the plurality of memory devices 1000. Therefore, the controller may require a large amount of memory resources to count the number of accesses to each of the rows.

The controller may count the number of accesses to a plurality of row groups each including a plurality of rows. Further, the controller may control the memory pool to perform a refresh operation on a row group of which the access count exceeds a threshold value. When some rows in a row group are frequently accessed, the access count of the corresponding row group may exceed the threshold value. In this case, when a refresh operation is performed on the entire row group, power consumption may be increased.

In accordance with an embodiment, the controller may control the memory pool including a plurality of memory regions. The controller may count the number of accesses to each row group including one or more rows, and flexibly decide a row group size, i.e. the number of rows in the row group according to a predetermined standard.

In an embodiment, the controller may decide the row group sizes of the respective memory regions, based on the row access counts of the respective memory regions, which are varied with time. The controller may group the rows of the respective memory regions by the corresponding row group sizes. When a certain row is accessed, the controller may increase the representative access count of the row group including the row. Furthermore, the controller may provide a command to the memory pool to perform a target refresh operation on a row group whose representative access count exceeds a threshold value.

In accordance with an embodiment, the controller may flexibly determine the row group sizes of the respective memory regions according to the predetermined criterion, thereby optimizing the amount of memory resources and power consumption which are required for counting the number of accesses.

Figure 2:
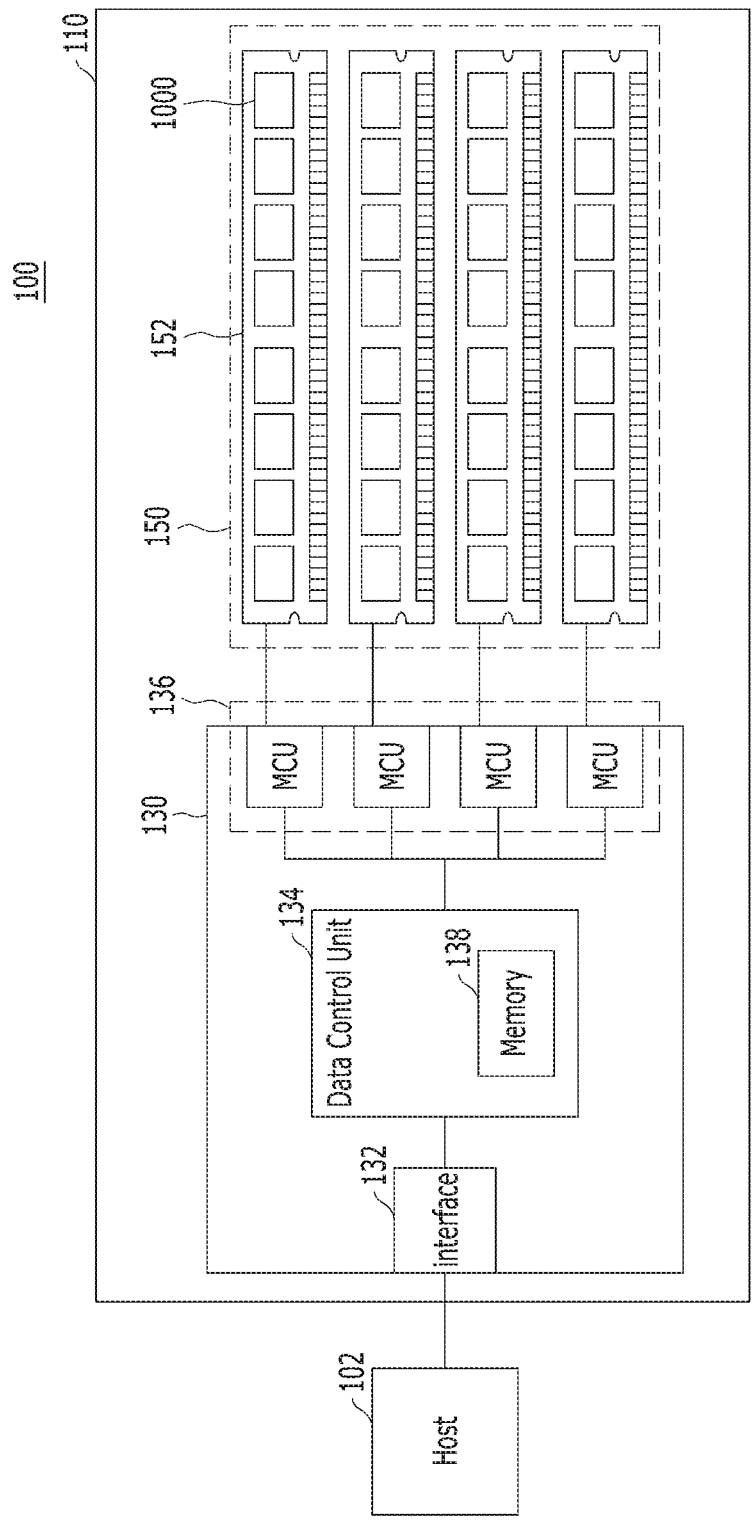
FIG. 2 illustrates a structure of a data processing system including a memory system in accordance with an embodiment.

FIG. 2 schematically illustrates a structure of a data processing system 100 including a memory system 110 in accordance with an embodiment.

Referring to FIG. 2, the data processing system 100 may include a host 102 and the memory system 110.

The host 102 may include one or more processing elements. The host 102 may transfer a command to the memory system 110. The memory system 110 may operate in response to the command of the host 102. In particular, the memory system 110 may store data accessed by the host 102. The memory system 110 may be used as a main memory device or an auxiliary memory device of the host 102.

The memory system 110 may include a controller 130 and a memory pool 150. The memory pool 150 may write data and read stored data, in response to control of the controller 130.

The memory pool 150 may include a plurality of memory modules 152, and each of the memory modules 152 may include a plurality of memory devices 1000. The plurality of memory devices 1000 may have the same characteristics or different characteristics. In various embodiments, the memory module 152 may include the memory devices 1000 having different characteristics in terms of storage capacity or latency. That is, one memory module 152 may be a convergence memory device in which a plurality of memory devices such as a dynamic random access memory (DRAM), a phase-change RAM (PCRAM), a magnetic RAM (MRAM), a spin-transfer torque RAM (STT-RAM) and a flash memory are converged.

In an embodiment, the memory module 152 may be a dual in-line memory module (DIMM). For example, the memory module 152 may be an unbuffered dual in-line memory module (UDIMM), registered dual in-line memory module (RDIMM), load reduced dual in-line memory module (LRDIMM), fully buffered dual in-line memory module (FBDIMM) or the like.

The memory pool 150 may be divided into a plurality of memory regions. Each memory region may include one or more memory modules 152 or one or more memory devices 1000.

The controller 130 may include a data control unit 134, a plurality of memory control units (MCUs) 136 and an input and output (I/O) interface 132.

The data control unit 134 may control overall operations of the memory system 110. For example, the data control unit 134 may control a write operation of writing write data provided from the host 102 to the memory pool 150 in response to a write command. For another example, the data control unit 134 may control a read operation of reading data stored in the memory pool 150 and providing the read data to the host 102, in response to a read command.

In an embodiment, the data control unit 134 may include a memory 138 for an operation of the memory system 110. The memory 138 may store the access counts of the respective row groups which will be described below.

The plurality of memory control units 136 may support interfacing between the data control unit 134 and the respective memory modules 152.

The I/O interface 132 may support interfacing between the data control unit 134 and the host 102. At this time, the host 102 and the I/O interface 132 may be connected through an interconnect board 300 which will be described below with reference to FIG. 7. The I/O interface 132 may output data transferred from the data control unit 134 to the host 102, and input data received from the host 102 to the data control unit 134, using protocols related to one or more wired/wireless communication techniques. For example, the I/O interface 132 may support communication between the data control unit 134 and the host 102 according to protocols such as Peripheral Component Interconnect Express (PCIe), QuickPath Interconnect (QPI) and Ethernet. Furthermore, the I/O interface 132 may support communication between the data control unit 134 and the host 102 according to interface specifications such as Cache Coherent Interconnect for accelerators (CCIX) and GEN-Z.

Figure 3:
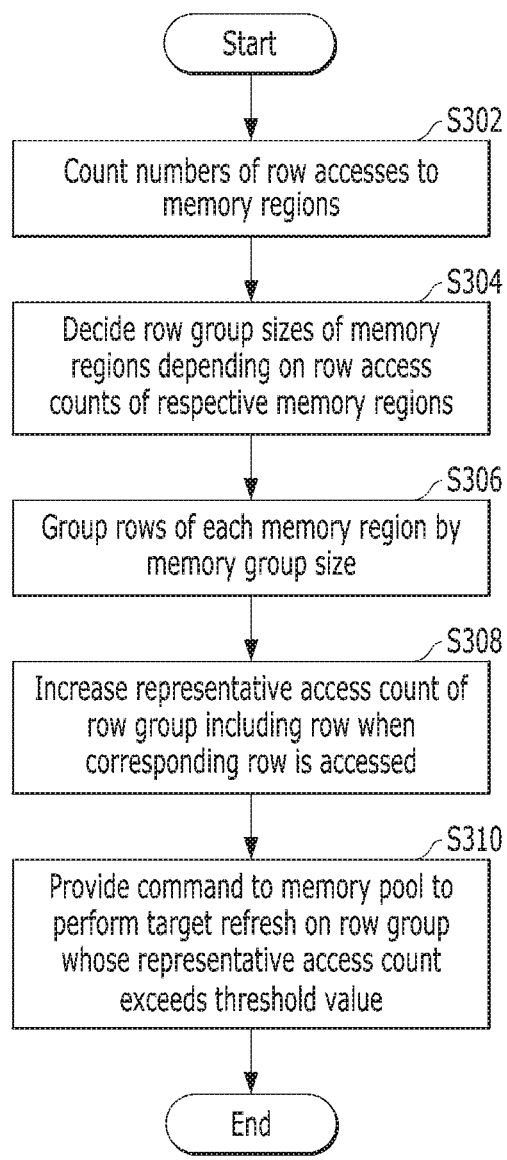
FIG. 3 is a flowchart illustrating an operation of a memory system in accordance with an embodiment.

FIG. 3 is a flowchart illustrating an operation of a memory system (e.g., the memory system 110 of FIG. 2) in accordance with an embodiment.

Referring to FIG. 3, at step S302, the controller 130 may count the number of row accesses to the respective memory regions, which vary with time.

The row access counts of the respective memory regions may be different depending on the properties of data stored in the memory regions and access patterns of the host 102. Furthermore, as the properties of the data stored in the memory regions and the access patterns of the host 102 are changed, the row access counts of the respective memory regions may be varied with time.

At step S304, the controller 130 may determine the row group sizes of the memory regions according to the row access counts of the respective memory regions.

In an embodiment, the controller 130 may determine the row group sizes of the respective memory regions such that a memory region having a relatively high row access count has a larger row group size than a memory region having a relatively low row access count.

In an embodiment, the controller 130 may determine the row group sizes of the respective memory regions such that a memory region having a row access count greater than or equal to a threshold value has a larger row group size than a memory region having a row access count less than the threshold value. That is, the controller 130 may determine the row group sizes based on one or more threshold values and the row access counts of the respective regions, which are varied with time.

The controller 130 may determine the one or more threshold values based on the row access counts of the respective memory regions, which are varied with time. For example, the controller 130 may determine a representative value as a threshold value. The representative value may include the average value or median value of the row access counts of the respective memory regions, which are varied with time.

At step S306, the controller 130 may group the rows in each of the memory regions by the corresponding row group size.

In accordance with the present embodiment, the row groups of a memory region which are frequently accessed may include more rows than the row groups of a memory region which are infrequently accessed.

In an embodiment, the controller 130 may set one or more sequential rows to a row group based on the row group size.

FIG. 4A schematically illustrates the structure of a memory cell array, for example, the memory cell array 1010 of FIG. 1.

By way of example, FIG. 4A illustrates row-direction arrangements of the memory cells within the memory cell array 1010. The memory cells may be arranged as 18 rows. The example of FIG. 4A is based on the supposition that the size of a row group of a memory region including the memory cell array 1010 is '3'. The controller 130 may set three rows of the memory cell array 1010 to one row group. In FIG. 4A, shaded fourth to sixth rows Row 4 to Row 6 may indicate one of the row groups.

FIG. 4B schematically illustrates a part of data stored in the memory 138.

Referring to FIG. 4B, the memory 138 may store the representative access counts of the respective row groups. As shown in FIG. 4A, memory cells may include 18 rows, which may be divided into six row groups. For convenience, FIG. 4B illustrates the indexes of the respective row groups and the rows in each of the row groups. For example, a second row group may include the fourth to sixth rows Row_4 to Row_6.

Referring back to FIG. 3, at step S308, when a certain row is accessed, the controller 130 may increase the representative access count of the row group including the row.

For example, when a memory cell of the fourth row Row_4 is accessed, the controller 130 may increase the representative access count of the second row group including the fourth to sixth rows Row_4 to Row_6. Even when a memory cell of the fifth row Row_5 or a memory cell of the sixth row Row_6 is accessed, the controller 130 may also increase the representative access count of the second row group.

At step S310, the controller 130 may provide a command to the memory pool 150 to perform a target refresh operation on a row group whose representative access count exceeds a threshold value, among the row groups.

Specifically, the controller 130 may provide a command to the memory device 1000 including the corresponding row group, such that the refresh operation is performed on the row group in response to the refresh command. The memory device 1000 may drive the refresh control circuit 1050 of FIG. 1 to perform a refresh operation on the corresponding row group.

A row group of a memory region which is frequently accessed may include a large number of rows. Therefore, when the controller 130 controls a target refresh operation for the row group of the frequently accessed memory region, the target refresh operation may be performed on the large number of rows at a time. The controller 130 may control the memory device 1000 in the frequently accessed memory region to perform the target refresh operation on the large number of rows at a time, thereby maintaining the reliability of data stored in the frequently accessed memory region. The controller 130 may count the number of accesses to a small number of row groups including a large number of rows in the frequently accessed memory region, thereby reducing the memory resource consumption of the memory 138.

On the other hand, a row group of an infrequently accessed memory region may include a small number of rows. Therefore, when the controller 130 controls a target refresh operation for the row group of the infrequently accessed memory region, the target refresh operation may be performed on the small number of rows at a time. Although some rows of the infrequently accessed memory region are accessed at a high frequency, the memory region may be infrequently accessed as a whole. Thus, although the memory device 1000 performs a target refresh operation on the small number of rows at a time, the reliability of data stored in the infrequently accessed memory region may be maintained. Therefore, the controller 130 may control the memory device 1000 in the infrequently accessed memory region to perform the target refresh operation on the small number of rows at a time, thereby reducing the power consumption of the memory system 110.

In accordance with the present embodiment, the controller 130 may calculate the representative access counts of row groups having different sizes in each of the memory regions, according to the access count of each of the memory regions, which is varied with time. Therefore, the limited power and memory resources of the memory system 110 may be efficiently used to maintain the reliability of the memory system 110.

When the access count of a certain row group exceeds a predetermined threshold value, row hammering may occur in a neighboring row of the row group. With reference to FIGS. 4A and 4B, when the access count of the second row group exceeds the predetermined threshold value because the fourth row is frequently accessed, row hammering may occur in the third row around the second row group.

Thus, in accordance with an embodiment, the controller 130 may provide a refresh command for the row group of which the representative access count exceeds the threshold value and a refresh command for the neighboring row of the corresponding row group to the corresponding memory region. In accordance with an implementation, the range of the neighboring row may be dynamically changed. For example, the range of the neighboring row may be determined based on the temperature of the memory region.

Since the row access counts for the respective memory regions are varied with time, the row group sizes of the respective memory regions may be dynamically changed. In an embodiment, the controller 130 may reset the access counts of all row groups of a memory region whose row group size is changed. Furthermore, the controller 130 may control the corresponding memory region to perform a target refresh operation on all rows of the memory region of which the access counts are reset. Although the access counts of the respective row groups of the corresponding memory region are not known, the controller 130 may perform the target refresh operation on all of the rows, thereby guaranteeing the reliability of data stored in the corresponding memory region.

The memory system 110 described with reference to FIGS. 1 to 4B may be mounted as a memory board in a rack, and configure a server system or data processing system such as a data center. The data processing system including the memory system 110 in accordance with the present embodiment will be described with reference to FIGS. 5 to 8.

Figure 5:
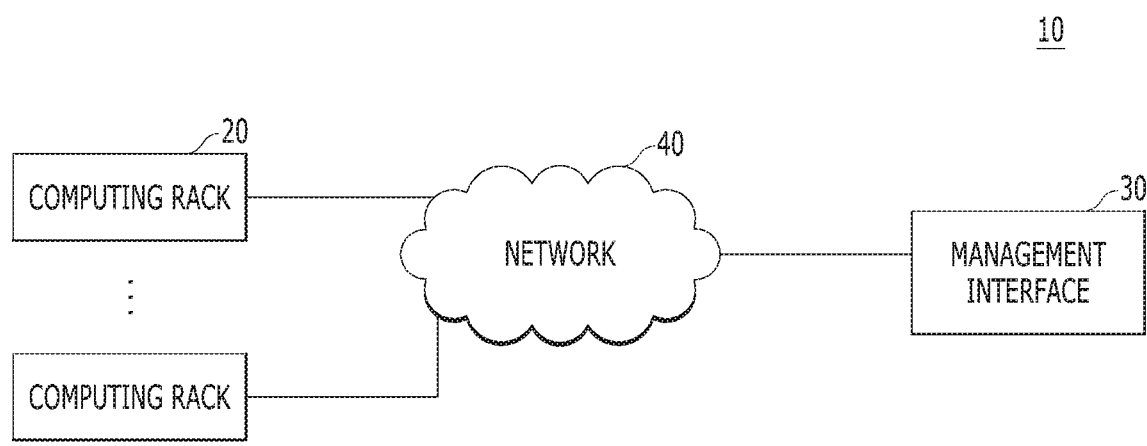
FIGS. 5 to 8 illustrate structures of data processing systems including a memory system in accordance with the present embodiment.

FIG. 5 is a block diagram illustrating a data processing system 10.

Referring to FIG. 5, the data processing system 10 may include a plurality of computing racks 20, a management interface 30, and a network 40 for communication between the computing racks 20 and the management interface 30. The data processing system 10 having this rack scale architecture may be used by a data center for processing large-scale data.

Each of the computing racks 20 may individually implement one computing device. Alternatively, each of the computing racks 20 may be combined with one or more other computing racks to implement one computing device. Example structures and operations of the computing racks 20 are described below.

The management interface 30 may provide an interactive interface for a user to control, administrate, or manage the data processing system 10. The management interface 30 may be implemented as any type of a computing device that includes any of a computer, a multi-processor system, a server, a rack-mount server, a board server, a lap-top computer, a notebook computer, a tablet computer, a wearable computing device, a network device, a web device, a distributed computing system, a processor-based system, a consumer electronic device, and the like.

In some embodiments of the present disclosure, the management interface 30 may be implemented as a distributed system having operation functions which may be performed by the computing racks 20 or having user interface functions which may be performed by the management interface 30. In other embodiments of the present disclosure, the management interface 30 may be implemented as a virtual cloud server that includes multi-computing devices distributed through the network 40. The management interface 30 may include a processor, an input/output subsystem, a memory, a data storage device, a communication circuit, and the like.

The network 40 may provide and/or receive data between the computing racks 20 and the management interface 30 and/or among the computing racks 20. The network 40 may be implemented with an appropriate number of various wired and/or wireless networks. For example, the network 40 may include a publicly accessible global network, such as a wired or wireless local area network (LAN), a wide area network (WAN), a cellular network, and/or the Internet. In addition, the network 40 may include an appropriate number of auxiliary network devices, such as auxiliary computers, routers, switches, and the like.

Figure 6:
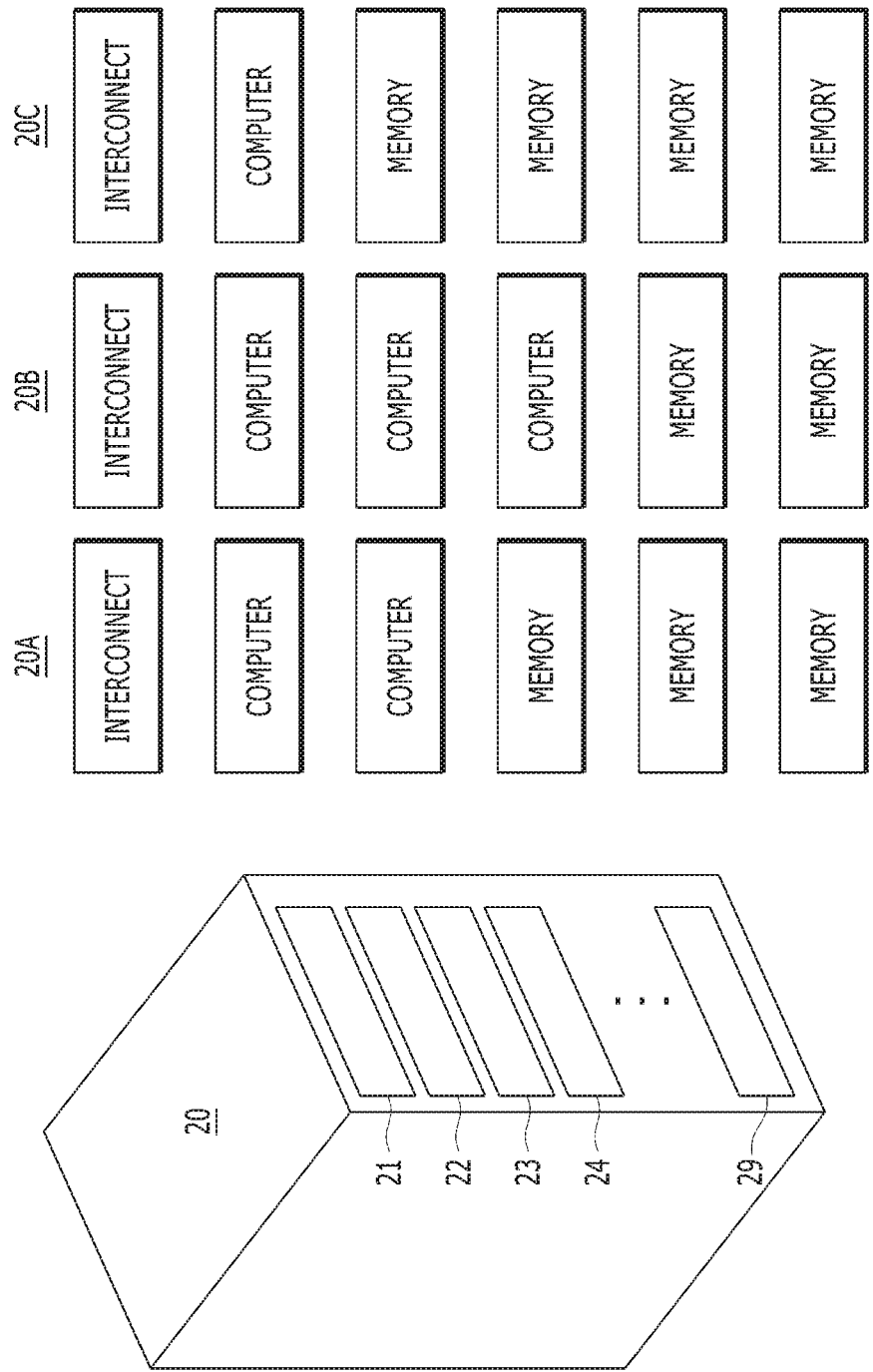

FIG. 6 illustrates an architecture of a computing rack 20 in accordance with an embodiment of the present disclosure.

Referring to FIG. 6, the computing rack 20 may include constituent elements in various forms and structures. For example, the computing rack 20 may include a plurality of drawers 21 to 29. Each of the drawers 21 to 29 may include a plurality of modules, each of which may include a plurality of boards.

In various embodiments of the present disclosure, the computing rack 20 may be implemented by a combination of appropriate numbers of computer boards, memory boards, and/or interconnect boards. The computing rack 20 is described as a combination of boards, but the computing rack 20 may also be implemented by other elements such as drawers, modules, trays, boards, sashes, or other suitable units. The computing rack 20 may have a structure in which its constituent elements are disaggregated and classified according to their functions. The computing rack 20 may have a structure of an interconnect board, a computer board, and a memory board with a classification order from the top down, although the computing rack 20 is not limited to such structure. The computing rack 20 and a computing device including the computing rack 20 may be referred to as 'a rack-scale system' or 'a disaggregated system.'

In an embodiment of the present disclosure, a computing device may be implemented as one computing rack 20. In other embodiments, the computing device may be implemented by all or some constituent elements of two or more computing racks 20, or some constituent elements of one computing rack 20.

In various embodiments of the present disclosure, a computing device may be implemented by a combination of appropriate numbers of computer boards, memory boards, and interconnect boards that are included in the computing rack 20. For example, a computing rack 20A may include two computer boards, three memory boards, and one interconnect board. In other examples, a computing rack 20B may include three computer boards, two memory boards, and one interconnect board. In other examples, a computing rack 20C may include one computer board, four memory boards, and one interconnect board.

Although FIG. 6 illustrates examples in which the computing rack 20 includes appropriate numbers of computer boards, memory boards, and interconnect boards, the computing rack 20 may include additional constituent elements that may be included in typical servers, such as a power system, a cooling system, an input/output device, and so on.

Figure 7:
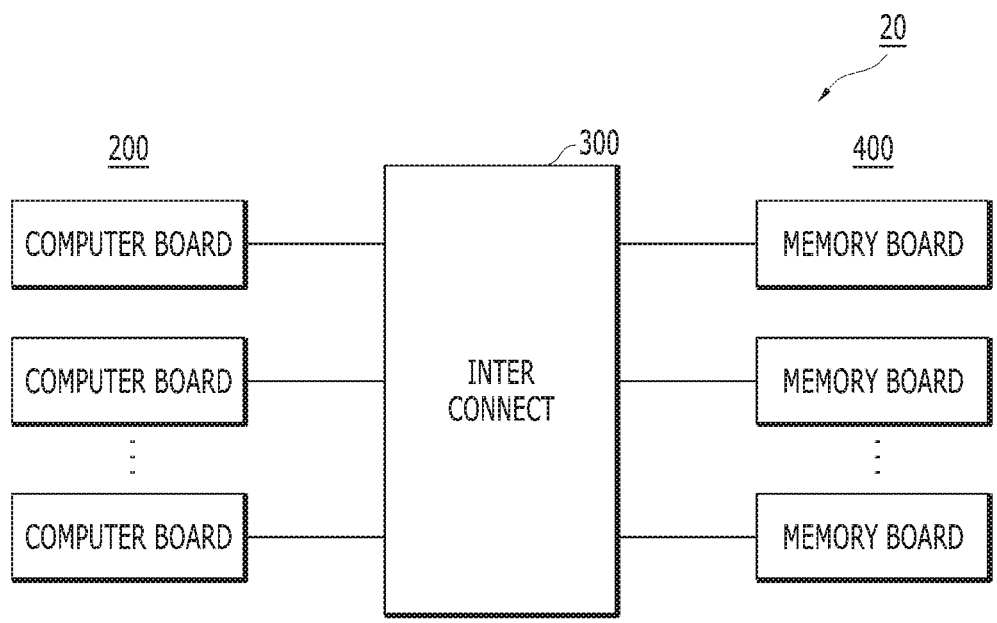

FIG. 7 illustrates a computing device 20 in accordance with an embodiment of the present disclosure.

Referring to FIG. 7, the computing device 20 may include a plurality of computer boards 200, a plurality of memory boards 400, and an interconnect board 300. The computer boards 200 may be pooled computer boards or pooled computer systems. The memory boards 400 may be pooled memory boards or pooled memory systems. The computing device 20 is described as a combination of a plurality of boards, but the computing device 20 may also be implemented by elements such as drawers, modules, trays, boards, sashes, or other suitable units.

Each of the computer boards 200 may include processing elements such as one or more processors, processing/control circuits and central processing units (CPUs). The host 102 described with reference to FIG. 1 may correspond to the computer board 200.

Each of the memory boards 400 may include various types of memories such as a plurality of volatile memories and/or nonvolatile memories. For example, each of the memory boards 400 may include a plurality of dynamic random access memories (DRAMs), flash memories, memory cards, hard disk drives (HDDs), solid state drives (SSDs) and/or combinations thereof.

The memory system 110 described with reference to FIGS. 1 to 4 may correspond to each of the memory boards 400. The memory board 400 may include a plurality of memory regions. The memory board 400 may count the number of row accesses to the respective memory regions, which are varied with time, and determine the row group sizes of the memory regions according to the access counts of the respective memory regions. The memory board 400 may group rows of each of the memory regions by the corresponding row group size. When a certain row is accessed, the memory board 400 may increase the representative access count of the row group including the row. Furthermore, the memory board 400 may provide a command to the corresponding memory region to perform a target refresh operation on a row group whose representative access count exceeds the threshold value, among the row groups. Therefore, in accordance with the present embodiment, the memory system 110 can maintain the reliability of each of the memory boards 400 by efficiently using the limited power and memory resource of the memory board 400.

Each of the memory boards 400 may be divided, allocated, or designated by and used by one or more processing elements that are included in each of the computer boards 200. Also, each of the memory boards 400 may store one or more operating systems (OS) that may be initialized and/or executed by the computer boards 200.

The interconnect board 300 may include a communication circuit, a communication device, or a combination thereof, which may be divided, allocated, or designated by and used by one or more processing elements included in each of the computer boards 200. For example, the interconnect board 300 may be implemented by any suitable number of network interface ports, interface cards, or interface switches. The interconnect board 300 may use protocols related to one or more wired communication technologies for communication. For example, the interconnect board 300 may support communication between the computer boards 200 and the memory boards 400 based on one or more of protocols such as peripheral component interconnect express (PCIe), QuickPath interconnect (QPI), Ethernet, and the like.

Figure 8:
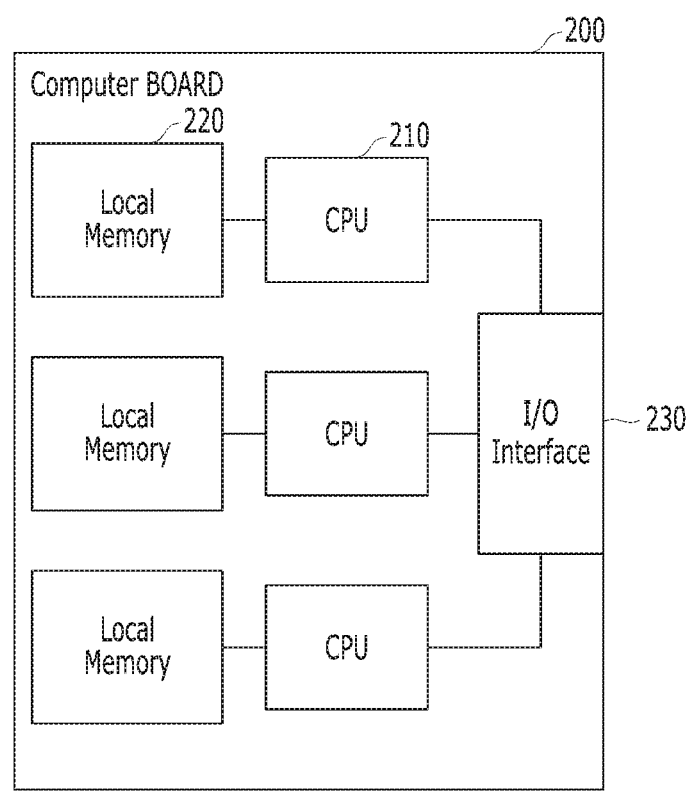

FIG. 8 is a block diagram illustrating a computer board 200 in accordance with an embodiment of the present disclosure.

Referring to FIG. 8, the computer board 200 may include one or more central processing units (CPUs) 210, one or more local memories 220, and an input/output (I/O) interface 230.

The CPUs 210 may divide, allocate, or designate one or more memory boards to be used, among the memory boards 400 illustrated in FIG. 7. Also, the CPUs 210 may initialize the one or more memory boards, and perform a data read operation and/or a data write (i.e., program) operation on the one or more memory boards.

The local memories 220 may store data to perform an operation of the CPUs 210. In various embodiments of the present disclosure, the local memories 220 may have a one-to-one correspondence with the CPUs 210.

The input/output interface 230 may support interfacing between the CPUs 210 and the memory boards 400 through the interconnect board 300 of FIG. 7. The input/output interface 230 may use protocols related to one or more wired communication technologies, output and provide data from the CPUs 210 to the interconnect board 300, and receive data inputted from the interconnect board 300 to the CPUs 210. For example, the input/output interface 230 may support communication between the CPUs 210 and the interconnect board 300 using one or more of protocols such as peripheral component interconnect express (PCIe), QuickPath interconnect (QPI), Ethernet and the like.

In accordance with the present embodiments, it is possible to provide a memory system which determines data attributes by reflecting access counts of local addresses, respectively, and sorts and stores data having different attributes in a memory pool.

In accordance with the present embodiments, it is possible to provide a method capable of preventing data distortion caused by row hammering while efficiently using limited memory resources and power of a memory system, and the memory system using the same.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
a memory pool comprising a plurality of memory regions; and
a controller suitable for controlling the memory pool,
wherein each of the memory regions comprises one or more row groups, each row group having a predetermined row group size, and
wherein the controller counts the number of row accesses to the respective memory regions, determines row group sizes according to the row access counts of the respective memory regions, increases a representative access count of a row group including a certain row when the row is accessed, and provides a command to the memory pool to perform a target refresh operation on a target row group whose representative access count exceeds a threshold value.

2. The memory system of claim 1, wherein the controller determines the row group sizes of the respective memory regions such that a memory region having a relatively high row access count has a larger row group size than a memory region having a relative low row access count.

3. The memory system of claim 1, wherein the controller further provides a command to the memory pool to perform a target refresh operation on adjacent rows of the target row group.

4. The memory system of claim 1, wherein the controller groups sequential rows based on the row group sizes.

5. The memory system of claim 1, wherein the controller resets the representative access counts of all row groups in a memory region having a row group size which is changed.

6. The memory system of claim 5, wherein the controller provides a command to the memory region in which the representative access counts of all the row groups are reset, such that a target refresh operation is performed on all rows of the corresponding memory region.

7. The memory system of claim 1, wherein the controller determines the row group sizes based on the row access counts of the respective memory regions and one or more threshold values, and determines the one or more threshold values based on the row access counts of the respective memory regions, which vary with time.

8. An operation method of a memory system which includes a plurality of memory regions each including one or more row groups, each row group having a predetermined row group size, the operation method comprising:

counting the number of row accesses to the respective memory regions;
determining row group sizes according to the row access counts of the respective memory regions;
increasing a representative access count of a row group including a certain row, when the row is accessed; and
providing a command to the memory pool to perform a target refresh operation on a target row group whose representative access count exceeds a threshold value.

9. The operation method of claim 8, wherein the determining of the row group sizes according to the row access counts of the respective memory regions comprises determining the row group sizes of the respective memory regions such that a memory region having a relatively high row access count has a larger row group size than a memory region having a relative low row access count.

10. The operation method of claim 8, further comprising performing a target refresh operation on adjacent rows of the target row group.

11. The operation method of claim 8, further comprising grouping sequential rows based on the row group sizes.

12. The operation method of claim 8, further comprising resetting the representative access counts of all row groups in a memory region having a row group size which is changed.

13. The operation method of claim 12, further comprising performing a target refresh operation on all rows of the memory region where the representative access counts of all the row groups are reset.

14. The operation method of claim 8, wherein the determining of the row group sizes according to the row access counts of the respective memory regions comprises determining the row group sizes based on the row access counts of the respective memory regions and one or more threshold values,
wherein the operation method further comprises determining the one or more threshold values based on the row access counts of the respective memory regions, which vary with time.

15. A memory system comprising:
a memory pool including a plurality of memory devices; and
a controller suitable for:
determining row access counts for each of a plurality of memory sets, each memory set including two or more memory devices;
allocating a size of a row group for each memory set, based on the corresponding row access counts, the row group including a plurality of rows;
updating group row access counts of a corresponding row group, in response to an access request;
performing a refresh operation on the corresponding row group based on the updated group row access counts.

16. The memory system of claim 15, wherein the controller performs the refresh operation when the updated group row access counts exceed a threshold value.

* * * * *